United States Patent [19]
Naoi et al.

[11] Patent Number: 5,241,263
[45] Date of Patent: Aug. 31, 1993

[54] ELECTRIC CURRENT DETECTING APPARATUS

[75] Inventors: Toshio Naoi, Machida; Katsuhiko Tajika, Nobeoka, both of Japan

[73] Assignee: Asahi Kasei Electronics Co. Ltd., Tokyo, Japan

[21] Appl. No.: 826,942

[22] Filed: Jan. 28, 1992

[30] Foreign Application Priority Data

Jan. 29, 1991 [JP] Japan .................... 3-009210

[51] Int. Cl.⁵ ...................... G01R 19/00; G01R 33/06
[52] U.S. Cl. .................................. 324/117 H; 324/127
[58] Field of Search ............... 324/117 H, 117 R, 127, 324/251, 252; 338/32 R, 32 H; 323/368; 307/309

[56] References Cited

U.S. PATENT DOCUMENTS

| | | | |
|---|---|---|---|
| 2,928,048 | 3/1960 | Postal | 324/117 R |
| 3,323,056 | 5/1967 | Haley | 324/117 R |
| 3,323,057 | 5/1967 | Haley | 307/309 |
| 4,639,665 | 1/1987 | Gary | 338/32 H |
| 4,791,361 | 12/1988 | Beifoff et al. | 324/117 H |
| 4,841,235 | 6/1989 | Hastings et al. | 324/117 R |

OTHER PUBLICATIONS

Patent Abstracts of Japan Application No. 61-225661, P-551, Feb. 25, 1987, vol. 11, No. 62.

*Primary Examiner*—Ernest F. Karlsen
*Attorney, Agent, or Firm*—Finnegan, Henderson, Farabow, Garrett & Dunner

[57] ABSTRACT

An electric current detecting apparatus having gaps in a looped core and a primary winding and a secondary winding around the looped core. The gaps have continuous portions in the looped core. A magnetoelectric transducer such as a Hall effect element is inserted into at least one of the gaps. The gaps and the secondary windings have the same dimension as well as the same shape and are symmetrically arranged to reduce damping oscillation and transient spike noise of the secondary current I2. The continuous portion prevents increase of magnetic reluctance of the core. The electric current detecting apparatus has good high frequency response characteristics and detects a large current of a square wave pulse at a high speed and with high fidelity.

17 Claims, 17 Drawing Sheets

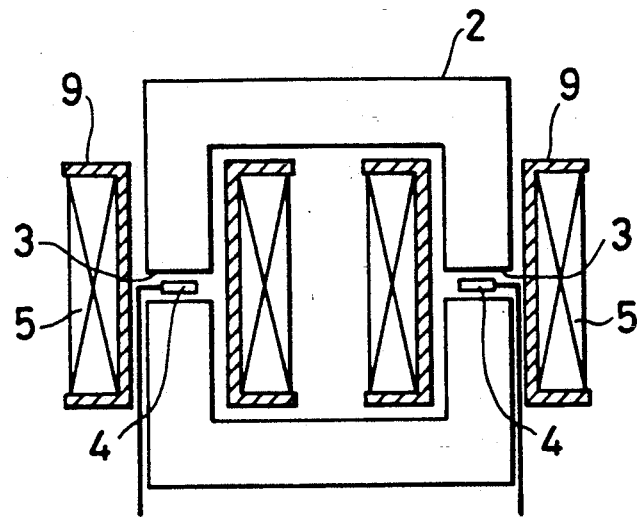
FIG. 3
(PRIOR ART)
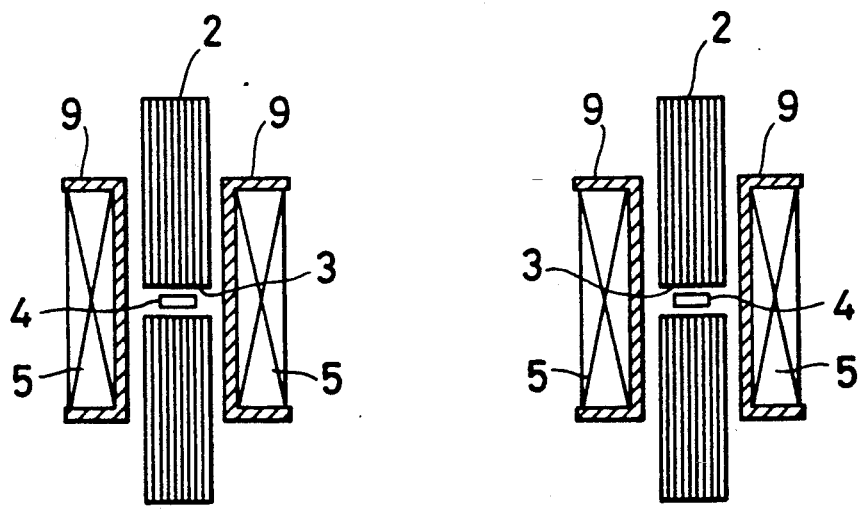
FIG. 4
(PRIOR ART)
FIG. 5
(PRIOR ART)

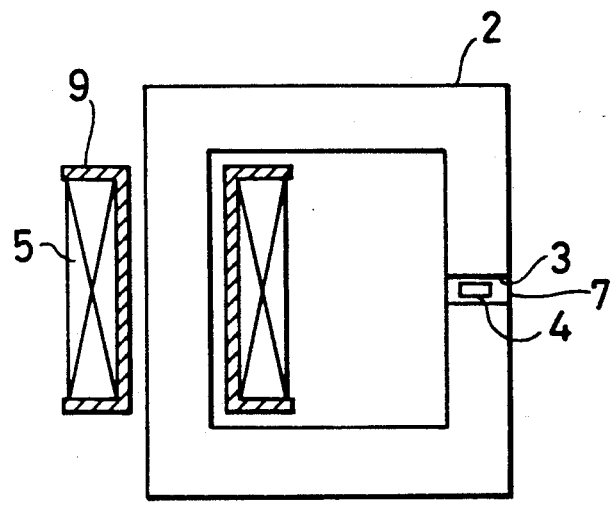
FIG. 6
(PRIOR ART)
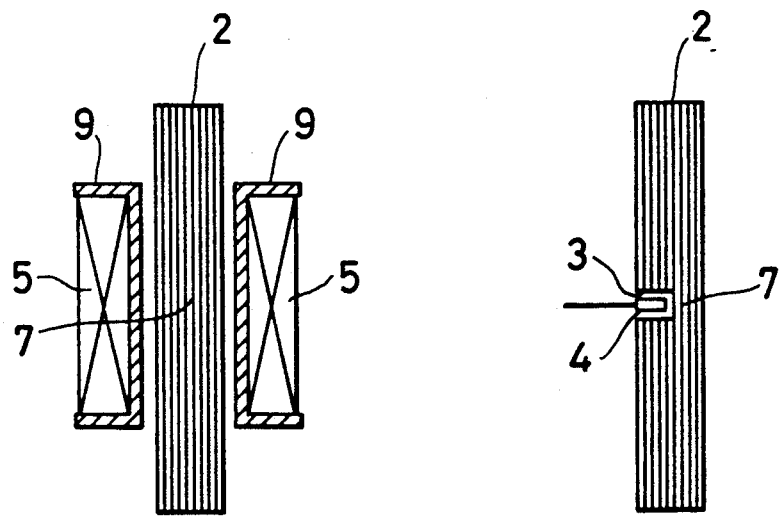
FIG. 7
(PRIOR ART)
FIG. 8
(PRIOR ART)

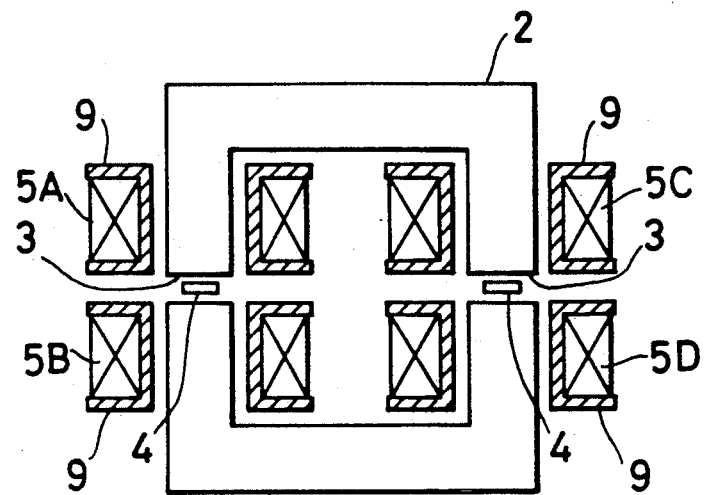
FIG. 21
(PRIOR ART)
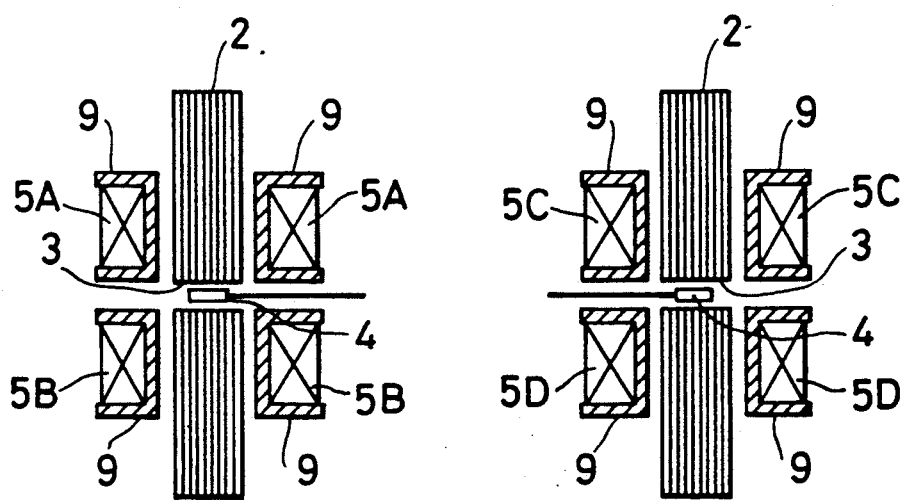
FIG. 22
(PRIOR ART)
FIG. 23
(PRIOR ART)

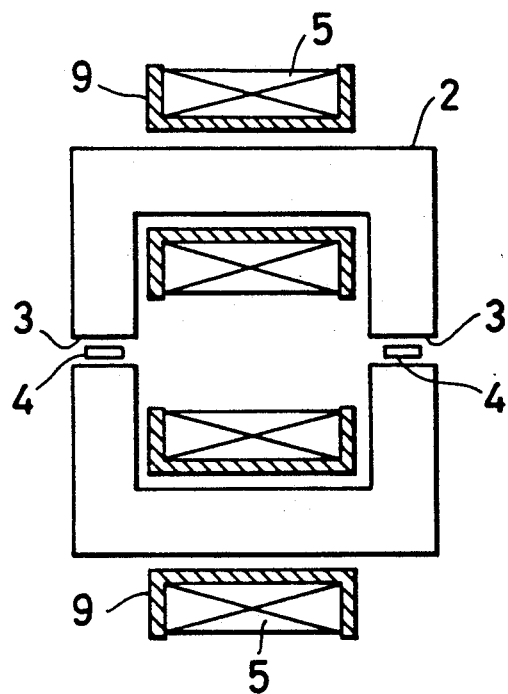
FIG. 24
(PRIOR ART)
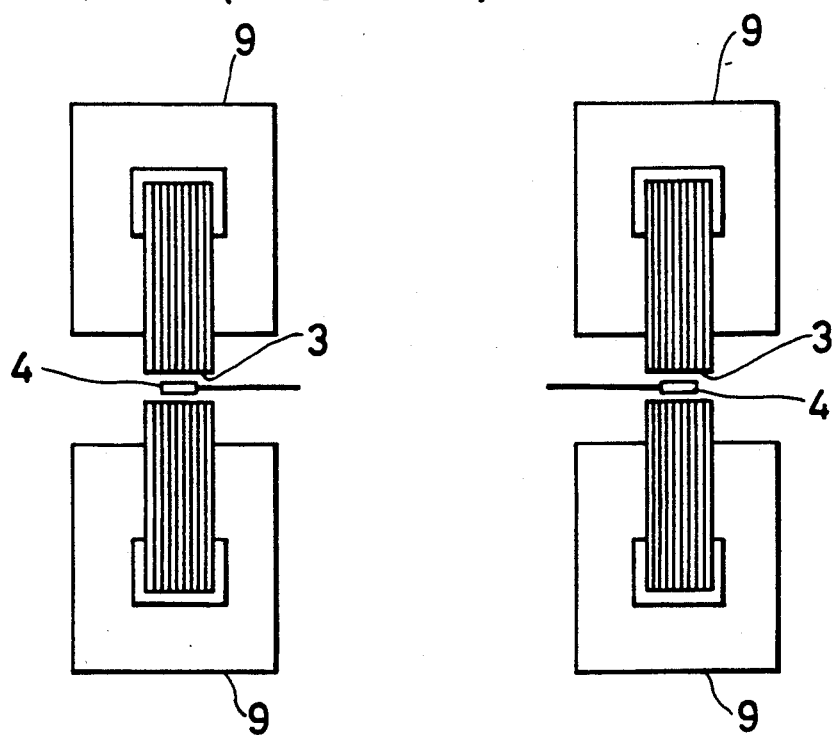
FIG. 25
(PRIOR ART)
FIG. 26
(PRIOR ART)

ELECTRIC CURRENT DETECTING APPARATUS

BACKGROUND OF THE INVENTION

1. Field of the Invention

The present invention relates to an electric current detecting apparatus using a magnetoelectric transducer and more particularly to an electric current detecting apparatus of a magnetic balanced type using a magnetoelectric transducer such as a Hall effect element.

2. Description of the Prior Art

An operation principle of an electric current detecting apparatus of a magnetic balanced type using a magnetoelectric transducer such as a Hall effect element will be explained with reference to FIG. 1. In FIG. 1, a magnetic flux is generated in a looped core 2 by a primary current $I_1$ flowing through a primary winding or conductor 1. A magnetic flux density in a gap 3 is measured by a magnetoelectric transducer 4 such as a Hall effect element. An output from the transducer 4 is applied to an amplifier 6 which functions as a current supply source to a secondary winding 5. That is, a secondary current $I_2$ is supplied from a current supply source 6 to the secondary winding 5 which is wound around the looped core 2 so that the magnetic flux density in the core 2 is cancelled to create a magnetically balanced condition. Under the magnetically balanced condition, the primary current $I_1$ can be measured by measuring the secondary current $I_2$ by an ammeter 12 arranged in the path between the amplifier 6 and the secondary winding 5, based on an equi ampere turns law where a magnitude of a magnetomotive force on a primary side is equal to that of a secondary side in a magnetically balanced condition.

Since either a dc current or an ac current can be measured by this electric current detecting apparatus of a magnetic balance type in a non-contact state and with a high accuracy, it has been frequently used in such a field as an inverter control system. However, a conventional apparatus has a disadvantage that high frequency characteristics are poor. This means that a measurement accuracy at a high frequency is deteriorated.

Especially in a recent inverter control system, a switching speed is required to be increased, so that an electric current detecting apparatus of a dc/ac type having good high-frequency characteristics is required. For instance, when a square wave is measured in pulse width modulation (PWM) control, a response delay of the secondary current $I_2$ occurs as shown in FIG. 2, and an electric current measurement accuracy is deteriorated because of waveform distortion or a peak value error. This is caused by deteriorated high-frequency characteristics of an electric current detecting apparatus, resulting in that high harmonic components included in the square wave of the primary current $I_1$ disappear from the secondary current $I_2$.

The present inventors examined the above response delay and have found that the response is delayed due to an increased leakage magnetic flux caused by an increased magnetic reluctance by the gap 3 of the looped core 2. Based on the above fact, the inventors invented the present invention.

Conventionally, various kinds of proposals on improvement of an electric current detecting apparatus have been offered. These proposals, however, have not yet developed an electric current detecting apparatus with sufficient performance.

For example, FIGS. 3 to 5 show an electric current detecting apparatus in which the magnetoelectric transducers 4 are disposed correspondingly in the gaps 3 arranged distributedly in the looped core 2. The secondary windings 5 accommodated in bobbins 9 are so arranged to surround these gaps 3, respectively. This electric current detecting apparatus can improve a measurement accuracy in the case of a dc or low frequency ac current, and particularly can avoid an error resulting from a change in a shape or a location (for instance, a center or a corner inside of the looped core 2 or the like) of the primary winding. However, this electric current detecting apparatus is not effective to improve high frequency characteristics.

In an electric current detecting apparatus as shown in FIGS. 6 to 8 where, the magnetoelectric transducer 4 is embedded in the gap 3 arranged in one portion of the core 2, in an electric current detecting apparatus which employs magnetic coupling between the primary winding and a core without a gap, or in an electric current detecting apparatus as shown in FIG. 9, where a yoke or a shield 13 is provided inside the secondary winding 5 in the bobbin 9, a response delay is improved. However, when the primary current changes greatly and rapidly, a damping oscillation (ringing) occurs, so that a settling time is increased and accordingly waveform distortion or a peak value error is unexpectedly deteriorated.

SUMMARY OF THE INVENTION

Accordingly, it is an object of the present invention to provide an electric current detecting apparatus of a magnetic balance type which can detect a large square-shaped pulse current flowing through a primary winding at a high speed and with a good fidelity.

It is another object of the present invention to provide an electric current detecting apparatus of a magnetic balance type which can also detect a large current of a square wave pulse flowing through the primary winding at a high speed and with a good fidelity, even in the case of detecting a large current of 100 A or more, for instance.

In the first aspect of the present invention, an electric current detecting apparatus comprises:

- a core of ferromagnetic material formed in a continuous loop, which material defines a completely closed magnetic circuit, the core having at least two variations in the cross-sectional configuration of the core which form two respective gaps of material extending only partially through respective cross-sections of the core;
- a primary winding comprising a conductor inserted into the looped core in which a primary current to be detected may be passed therethrough for generating a magnetic flux in the looped core;
- at least one magnetoelectric transducer arranged in at least one of the gaps and adapted for generating an output signal in accordance with the magnetic flux; and
- at least two secondary windings wound around the looped core to receive a secondary current passed therethrough in accordance with the signal for cancelling the magnetic flux so that the primary current is detected, wherein
- the at least two gaps and the at least two secondary windings are symmetrically arranged in the looped core, respectively, so as to obtain a uniform distribution of the magnetic flux in the looped core.

Here, the looped core may be a laminated structure having a plurality of ferromagnetic material sheets laminated.

The looped core may have a circular ring shape.

The looped core may have an oval ring shape.

The magnetoelectric transducer may be a Hall effect element.

The magnetoelectric transducer may be a magnetoresistance element.

In the second aspect of the present invention, an electric current detecting apparatus comprises:

A core of ferromagnetic material formed in a continuous polygon-shaped loop, which material defines a completely closed magnetic circuit the core having at least one pair of opposite arms and at least two variations in the cross-sectional configuration of the arms which form two respective gaps of material extending only partially through respective cross-sections of the arms;

a primary winding comprising a conductor inserted into the looped core in which a primary current to be detected may be passed therethrough for generating a magnetic flux in the looped core;

at least one magnetoelectric transducer arranged in at least one of the gaps configured to generate an output signal in accordance with the magnetic flux; and at least two secondary windings wound around said looped core to receive a secondary current passed therethrough in accordance with the signal for cancelling the magnetic flux so that the primary current is detected, wherein the at least two gaps and the at least two secondary windings are oppositely arranged in the opposite arms, respectively, so as to obtain a uniform distribution of the magnetic flux in the looped core.

The looped core may be a polygon loop having even number of corners.

The looped core may be a square loop.

The polygon loop may be a rectangular loop.

Each of the arms may have one secondary winding.

Each of the arms may have at least two secondary windings.

The magnetoelectric transducer may be a Hall effect element.

The magnetoelectric transducer may be a magnetoresistance element.

The above and other objects, effects, features and advantages of the present invention will become more apparent from the following description of embodiments thereof taken in conjunction with the accompanying drawings.

BRIEF DESCRIPTION OF THE DRAWINGS

FIG. 3 is a front view showing another example of a prior art structure or Comparative Example 1 of the present invention;

FIG. 4 is a left side cross-sectional view showing Comparative Example 1 shown in FIG. 3;

FIG. 5 is a right side cross-sectional view showing comparative example 1 shown in FIG. 3;

FIG. 6 is a front view showing a further example of a prior art structure or comparative example 4 of the present invention;

FIG. 7 is a left side cross-sectional view showing comparative example 4 shown in FIG. 6;

FIG. 8 is a right side cross-sectional view showing comparative example 4 shown in FIG. 6;

FIG. 21 is a front view showing another example of a prior art structure or Comparative Example 2 of the present invention;

FIG. 22 is a left side cross-sectional view showing Comparative Example 2 shown in FIG. 21;

FIG. 23 is a right side cross-sectional view showing Comparative Example 2 shown in FIG. 21;

FIG. 24 is a front view showing another example of a prior art structure of Comparative Example 3 of the present invention;

FIG. 25 is a left side cross-sectional view showing Comparative Example 3 shown in FIG. 24;

FIG. 26 is a right side cross-sectional view showing Comparative Example 3 shown in FIG. 24;

DETAILED DESCRIPTION OF PREFERRED EMBODIMENTS

Figure 1:
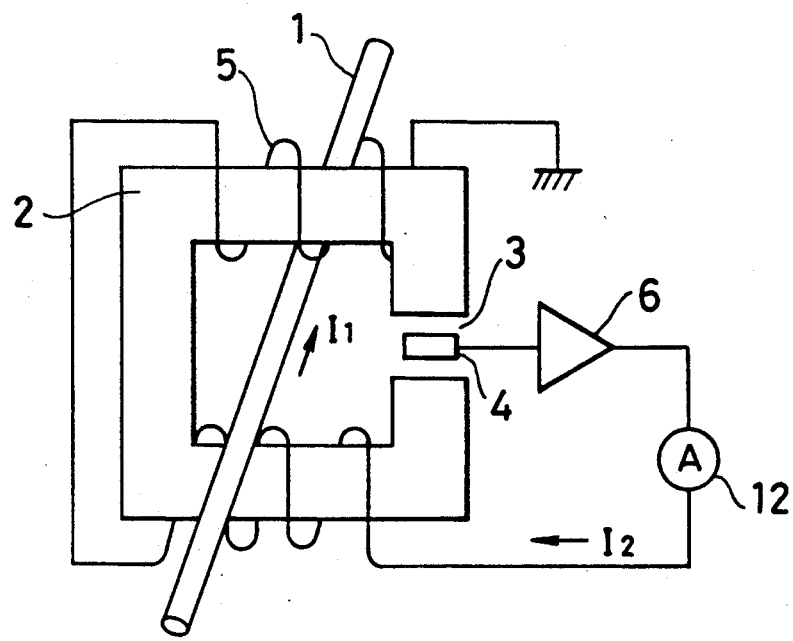
FIG. 1 is a schematic view showing an example of a basic structure of a conventional electric current detecting apparatus.
Figure 2:
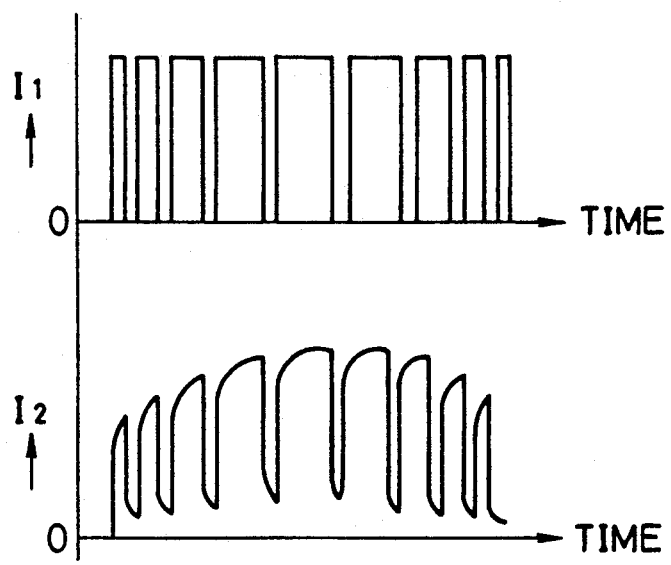
FIG. 2 illustrates input and output signal waveforms detected by the electric current detecting apparatus shown in FIG. 1.
Figure 9:
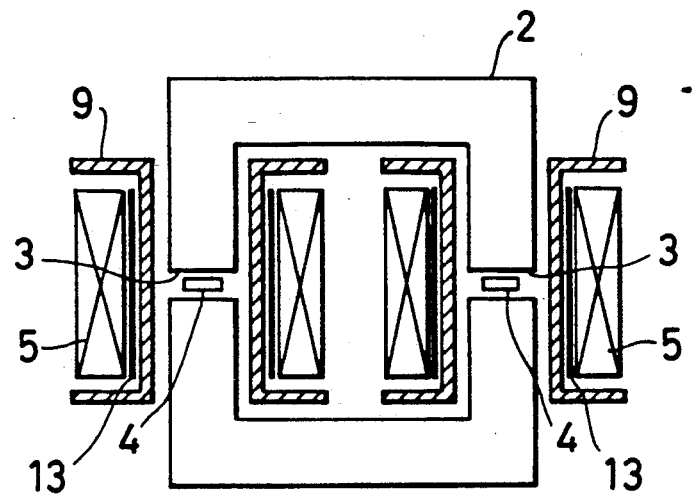
FIG. 9 is a cross-sectional view showing another example of a further prior art structure.

In the present invention, the inventors recognized that a leakage magnetic flux substantially deteriorates high frequency characteristics and lowers a response speed. With this in view, the inventors tried to lower a magnetic reluctance or resistance of the looped core. Since, however, it is necessary that the looped core has an air gap into which a magnetoelectric transducer such as a Hall effect element is inserted, the magnetic reluctance is inevitably increased.

Accordingly, an electric current detecting apparatus according to the present invention is so arranged that a magnetic reluctance of the looped core forming a closed magnetic circuit is not increased, even if a magnetoelectric transducer is inserted into a portion or a gap of the looped core.

Unlike a conventional apparatus shown in FIG. 8, in an electric current detecting apparatus according to the present invention, there are provided a plurality of gaps 3 and 8 which do not interrupt the looped core 2 completely and the gaps 3 and 8 are formed as a notch so that continuous portions 7 are left in the looped core. In this configuration, a response speed, that is, a period of time required that the secondary current $I_2$ reaches 90% of a predetermined value thereof is lowered and high frequency response characteristics are improved. In this configuration having an air gap in the form of non-interrupted notch, however, a damping oscillation and transient spike noise occurs.

According to the present invention, in order to prevent the above-mentioned problem of damping oscillation and transient spike noise due to the high response speed, the inventors have found a solution from experiments, which will be described below. In FIGS. 6 and 8, when a position of the primary winding is changed between a location of a central portion of the looped core 2 and a location other than the central portion, the inventors have found that a settling time of a damping oscillation or a period of time required that the secondary electric current $I_2$ reaches 95% or 105% of a predetermined value is varied in accordance with the above locations. As a result, it was found that the damping oscillation occurs when a distribution of an effective magnetic flux density of the core caused by the primary winding and the secondary windings is locally deviated and not uniform.

It is found that the reason why a magnetic flux does not distribute uniformly in the looped core results from a locally leaked magnetic flux. Thus, with this in view, second means for solving the problem is provided in addition to the looped core formed as a completely closed magnetic circuit. That is, concentrated constant components such as at least one pair of gaps, at least one pair of secondary windings and the like, are arranged symmetrically in the closed magnetic circuit with respect to the center point of the closed magnetic circuit.

Therefore, the present invention provides an electric current detecting device comprises a looped core formed by ferromagnetic material;

a primary winding inserted into a loop;

a plurality of gaps in the form of non-interrupted notch, each said gaps being arranged in a symmetrical relationship with each other, said looped core being not interrupted by said non interrupted notch;

a plurality of secondary windings, each two of said secondary windings being wound around said looped core in a symmetrical relationship with each other; and at least one magnetoelectric transducer arranged in at least one of said gaps and for detecting a magnetic field in said at least one gap.

The term "symmetrical relationship" is to be interpreted in a broad sense and implies any radial and diagonal dispositions of said gaps as well as such secondary windings.

The term "symmetry" means symmetry in terms of magnetoelectric coefficients of the magnetic circuit. For example, concentrated constant components such as gaps, secondary windings and the like are arranged symmetrically with respect to a line defined on a plane including the middle points of the thickness of all the arms of the core or a center point defined as a crossing point between two center lines, each defined as a center line of one pair of opposite arm. Alternatively, the looped core may have a ring-like shape to implement the symmetry. Here, the gaps and the secondary windings are arranged in the symmetrical relationship defined above.

Figures 10, 11:
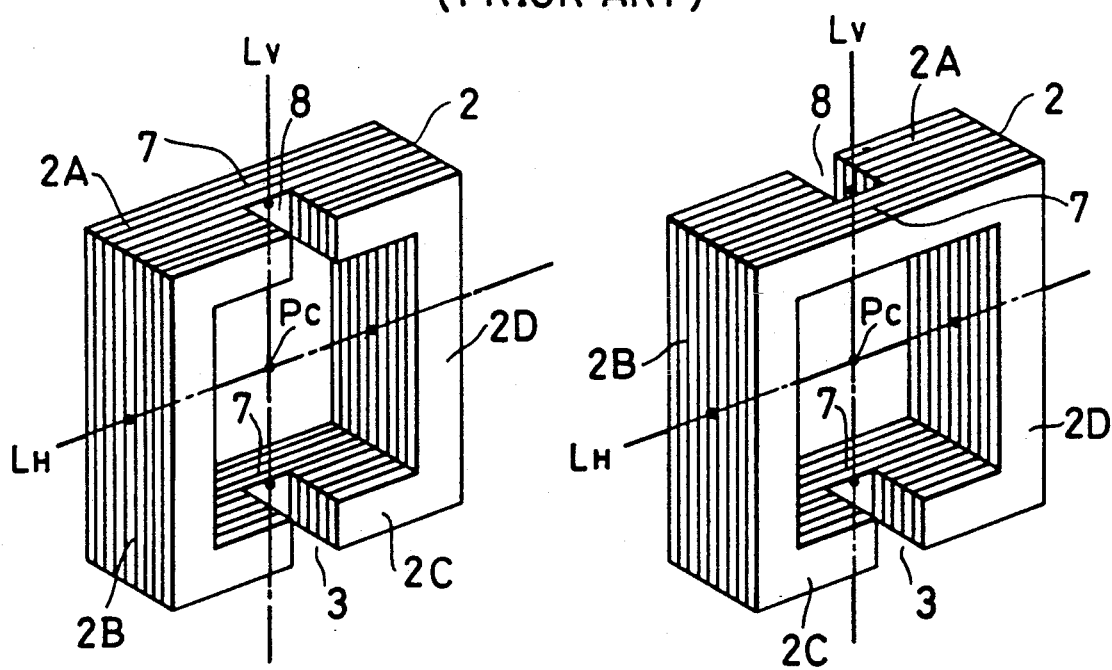
FIG. 10 is a perspective view showing an embodiment of a looped core used in an electric current detecting apparatus according to the present invention.
FIG. 11 is a perspective view showing another embodiment of a looped core used in an electric current detecting apparatus according to the present invention.

FIG. 10 shows an embodiment of the present invention in which the gaps 3 and 8 are arranged symmetrically with respect to a horizontal or vertical center line $L_V$ or $L_H$ defined on a plane including the middle points of the thickness of the four arms 2A, 2B, 2C and 2D of the core 2. FIG. 11 shows an embodiment of the present invention in which the gaps 3 and 8 in the form of non-interrupted notch are arranged symmetrically with respect to a center point defined as a crossing point $P_C$ between the vertical and horizontal center lines $L_V$ and $L_H$. In FIGS. 10 and 11, reference numeral 7 denotes a continuous portion of the looped core 2. Further, in FIGS. 10 and 11, the core 2 is so shaped to be symmetrical with respect to the vertical or horizontal center line $L_V$ or $L_H$ or the center point $P_C$.

According to the present invention, the gaps 3 and 8 are so formed or notched in the core 2 to have the continuous portions 7 and not to interrupt the looped core 2. The magnetoelectric transducer 4 is inserted into at least one of the gaps 3 and 8, and at the same time, it is required that the other gaps 8 arranged symmetrically with the gap 3 have the same concentrated constant magnetoelectric coefficients.

The looped core is formed by ferromagnetic material, for example, by laminating ferromagnetic material sheets, and has at least two pairs of arms 2A and 2C, and 2B and 2D, each pair having two opposite arms 2A and 2C, and 2B and 2D. The primary conductor can be inserted into a loop formed by the at least two pairs of arms 2A and 2C, and 2B and 2D. The loop can be square or rectangular. The laminating sheet is made by sheets formed by rolling a high permeability material.

There are provided an even number of gaps in the form of the notch. Each two of the gaps are arranged in two opposite arms 2A and 2C, and 2B and 2D in one pair in a symmetrical relationship with each other. Correspondingly, there are provided an even number of secondary windings. Each two of the secondary windings are wound around two opposite arms 2A and 2C, and 2B and 2D in one pair in a symmetrical relationship with each other.

At least one magnetoelectric transducer such as a Hall effect element, a magnetoresistance element for detecting a magnetic field in a gap where the transducer is housed.

Here, the gap 3 houses the transducer 4, while the gap 8 does not house the transducer 4. However, all the gaps 3 and 8 can house transducers 4 correspondingly.

Further, the same magnetoelectric coefficients can be realized by the same dimensions or shapes in the case of the gap, and the same diameter of a winding conductor or the same number of turns in the case of the secondary winding. This is an easy way to determine the same magnetoelectric coefficients in general. With respect to the symmetry of the core 2, the secondary windings 5, the gaps 3 and 8, however the symmetry refers not only to geometrical locations and shapes but also to magnetoelectric coefficients.

In the present invention, referring to FIGS. 10 and 11, the looped core 2 is structured by rectangularly laminating two or three parts of substantially rectangularly looped core sheets having fully encircled or partially interrupted arms and core sheets each of which has an arm forming a fragment of such a rectangularly looped core sheet, in such a way that the gaps 3 and 8 and the continuous portion 7 are formed. As a specific example, 15 sheets of permalloy, each of which is 0.2 mm thick and has an arm which is 3 or 5 mm wide, are laminated to form the core 2. The gaps 3 and 8 are formed by laminating 8 permalloy sheets and the continuous portion 7 is formed by laminating 7 permalloy sheets. When the permalloy sheet has the above dimensions or the above thickness and the width, high speed response was performed, if the continuous portion 7 has 3 or more permalloy sheets.

The secondary windings 5 are symmetrically distributedly arranged around the looped core 2 in such a way that the secondary windings 5 are accommodated into a plurality of (at most 4) bobbins 9. The number of turns of the secondary winding 5 is 2,500 turns in total per electric current detecting apparatus. The secondary windings 5 can be connected either in series or in parallel.

Specific embodiments will be explained below together with comparative examples with reference to FIGS. 12-26, in which a power supply source is not shown. In the embodiments, a Hall effect element formed by compound semiconductor such as InSb was used as the magnetoelectric transducer 4. It is preferable that the Hall effect element 4 embedded in the notch 8 of the looped core 2 is jointed or adhered to an edge surface of the looped core 2 as closely as possible.

Further, in FIGS. 10 and 11 and FIGS. 12-26, the primary winding or conductor 1 inserted into the looped core 2 is omitted to simplify the explanation of various embodiments of the present invention.

Embodiment 1

Figure 12:
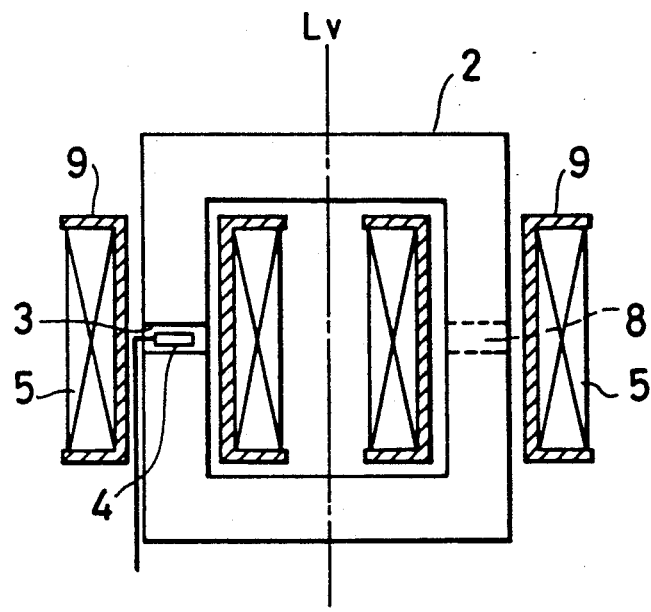
FIG. 12 is a front view showing Embodiment 1 of the present invention.
Figure 13:
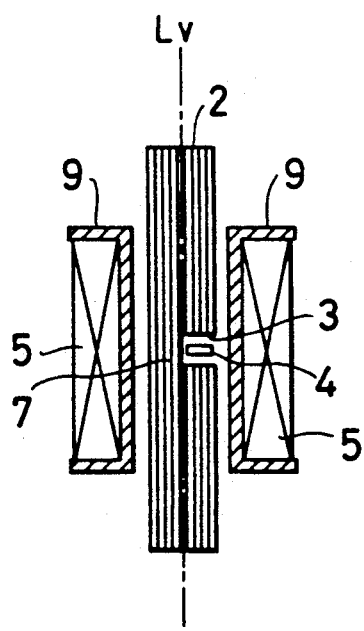
FIG. 13 is a left side cross-sectional view of Embodiment 1 shown in FIG. 12.
Figure 14:
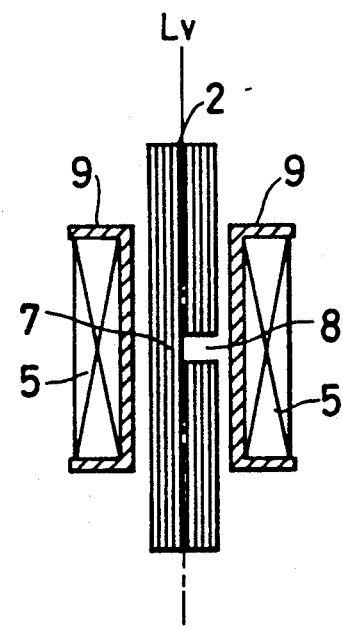
FIG. 14 is a right side cross-sectional view of Embodiment 1 shown in FIG. 12.

FIGS. 12 to 14 show Embodiment 1 of the present invention. In Embodiment 1, the two secondary windings 5 are wound so that the gaps 3 and 8 are surrounded by the windings 5. Here, the gaps 3 and 8 of the looped core 2 and the two windings 5 are arranged symmetrically with each other with respect to the vertical center line Lv. In other words the gaps 3 and 8 and the corresponding windings are arranged oppositely in the opposite arms of the polygonal core 2.

Embodiment 2

Figure 15:
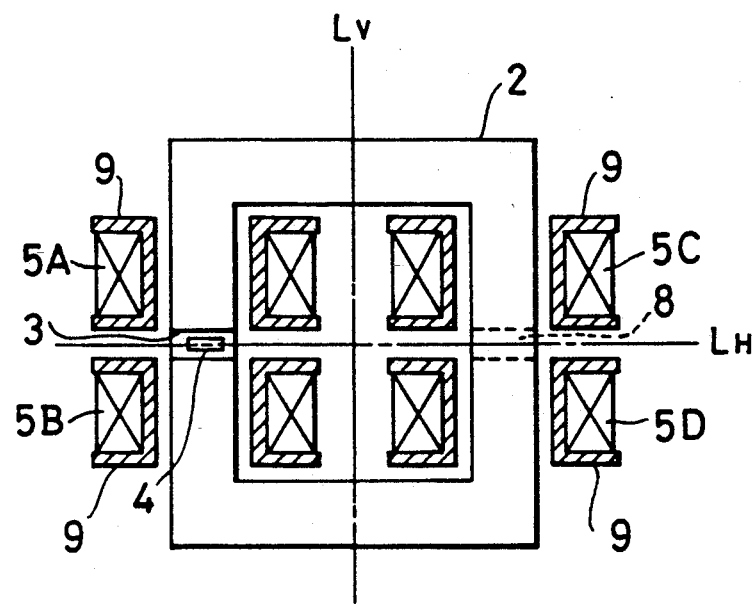
FIG. 15 is a front view showing Embodiment 2 of the present invention.
Figures 16, 17:
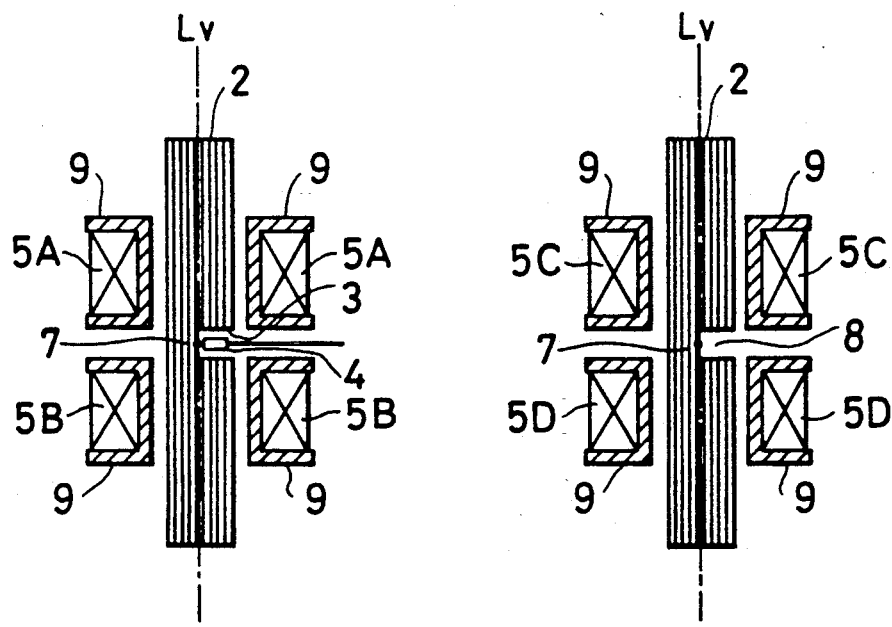
FIG. 16 is a left side cross-sectional view of Embodiment 2 shown in FIG. 15.
FIG. 17 is a right side cross-sectional view of Embodiment 2 shown in FIG. 15.

FIGS. 15 to 17 show Embodiment 2 of the present invention. In Embodiment 2, the two pairs of secondary windings 5A and 5B, and 5C and 5D are so arranged in the four bobbins 9 that one pair of the two windings 5A and 5B surround the gap 3 and that the other pair of the two windings 5C and 5D surround the gap 8. Here, the gaps 3 and 8 of the looped core 2 and the four windings 5A-5D are arranged symmetrically with respect to the vertical center line $L_V$. The bobbins 9 are divided into two vertically upper and lower portions at the horizontal center line $L_H$ so that lead terminals of the Hall effect element 4 can be easily connected to a power supply source. The two bobbins 9 on the other side of the looped core 2 has the same shape and are divided into vertically upper and lower two portions at the horizontal center line $L_H$.

Embodiment 3

Figure 18:
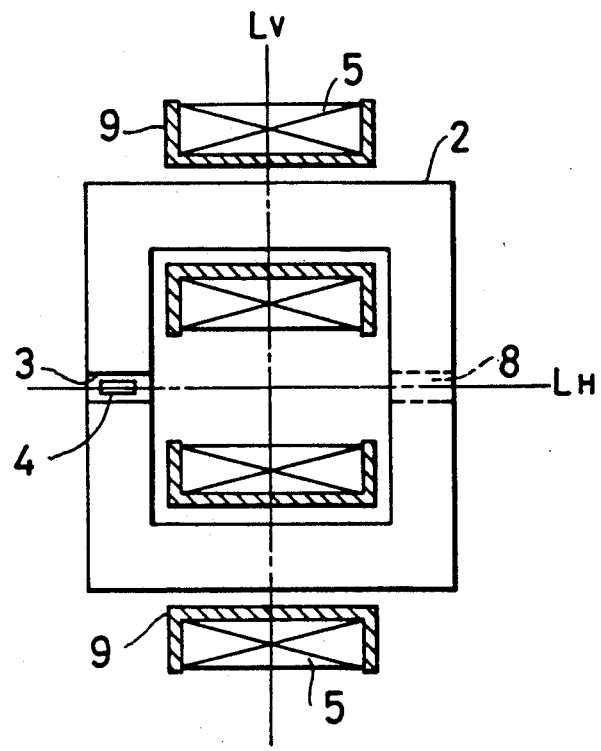
FIG. 18 is a front view showing Embodiment 3 of the present invention.
Figures 19, 20:
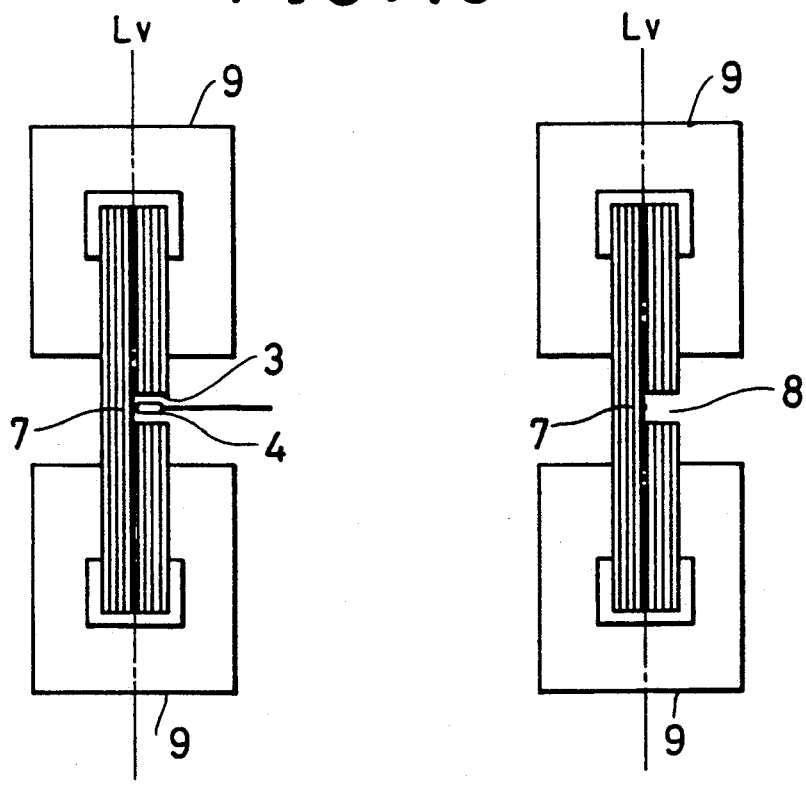
FIG. 19 is a left side cross-sectional view of Embodiment 3 shown in FIG. 18.
FIG. 20 is a right side cross-sectional view of Embodiment 3 shown in FIG. 18.

FIGS. 18 to 20 show Embodiment 3 of the present invention. In Embodiment 3, unlike Embodiments 1 and 2, the secondary widings 5 surround the horizontal core arms instead of the vertical core arms, and are arranged symmetrically with respect to the horizontal center line $L_H$, while the gaps 3 and 8 are arranged symmetrically with respect to the vertical center line $L_V$. Here, the gaps 3 and 8 are not surrounded by the windings 5.

Specific values in the embodiments of the present invention will be explained.

1) Ferromagnetic looped core 2

(1) Permalloy or the like is used which has a permeability $\mu$ of 100,000 or more and a thickness of 0.5 mm or less.

(2) The stacked core has a width of 3 mm or more, and all the piled sheets of the core have a thickness of 3 mm or more.

2) Secondary winding 5

(1) A insulation-coating conductor having a diameter of 0.1 mm or more is used.

(2) The number of turns of the secondary winding 5 is determined so that the secondary electric current $I_2$ corresponding to the rated primary electric current $I_1$ is 200 mA or less.

(3) In Embodiment 2, each distance between the two windings 5A and 5B, 5C and 5D as well is equal to or less than the maximum diameter of a cross section of the core 2.

(4) An inductance ratio between the two secondary windings 5, which are disposed in opposition to each other around the core 2, is 0.9-1.1 typically.

3) Gap 3 and 8

(1) A distance between an edge surface of the gap 3 or 8 in the core 2 and a surface of the magnetoelectric transducer 4 is narrow, and it is preferable that the above two surfaces closely contact a protective film or a molded resin.

(2) In the gap 3 having the magnetoelectric transducer 4 therein, a total gap length of the nonmagnetic gaps or notches is 0.5 mm or less.

(3) The sectional area of the continuous portion 7 adjacent to the gap 3 or 8 is 20%-80% of the whole cross-sectional area of the core 2.

4) Magnetoelectric transducer 4

(1) A Hall effect element of a semiconductor type or a magnetic resistance element of a ferromagnetic or semiconductor thin film type is used.

(2) While the magnetoelectric transducers 4 can be housed in the two gaps 3 and 8 of the core 2, it is sufficient the magnetoelectric transducer 4 may be inserted in that only one transducer is housed in one of the two gaps 3 and 8.

In order to evaluate operation performance obtained from the above three embodiments, the following comparative examples were formed so that the operation performance of the present embodiments are compared with that of prior art or comparative examples.

COMPARATIVE EXAMPLE 1

FIGS. 3 to 5 show Comparative Example 1 against the present invention. In Comparative Example 1, there is no notched gap which has a continuous portion and the gaps are all disconnected, contrary to Embodiment 1 of the present invention. The structure of Comparative Example 1 is the same as the structure of Embodiment 1 shown in FIGS. 12 to 14, except the gaps 3.

COMPARATIVE EXAMPLE 2

FIGS. 21 to 23 show Comparative Example 2 against the present invention. In Comparative Example 2, there is no notched gap which has a continuous portion and the gaps are all disconnected, contrary to Embodiment 2 of the present invention. The structure of Comparative Example 2 is the same as the structure of Embodiment 2 shown in FIGS. 15 to 17, except the gaps 3.

COMPARATIVE EXAMPLE 3

FIGS. 24 to 26 show Comparative Example 3 against the present invention. In Comparative Example 3, there is no notched gap which has a continuous portion and the gaps are all disconnected, contrary to Embodiment 3 of the present invention. The structure of Comparative example 3 is the same as the structure of Embodiment 3 shown in FIGS. 18 to 20, except the gaps 3.

COMPARATIVE EXAMPLE 4

FIGS. 6 to 8 show Comparative Example 4 against the present invention. In Comparative Example 4, the gap 3 having a continuous portion and accommodating the transducer 4 is formed so that the looped core 2 is not disconnected. However, there is only one gap 3, so that there is no gap arranged in symmetry with this gap. In addition, the secondary winding 5 is locally arranged, so that there is no secondary winding arranged in symmetry with this secondary winding as well.

Table 1 shows comparisons of various performances of the embodiments of the present invention with the comparative examples:

TABLE 1

| Examples of necessary performance | Response time ($\leq 1$ $\mu$s) | Settling time ($\leq 5$ $\mu$s) | Response noise width ($\leq 2$ $\mu$s) | Response noise peak value ($\leq 5\%$) |
|---|---|---|---|---|
| Embodiment 1 | 0 | 0 | 0 | 0 |
| Embodiment 2 | 0 | 0 | 0 | 0 |
| Embodiment 3 | 0 | 0 | 0 | 0 |
| Comparative Example 1 | 1 | 8 | 0 | 0 |
| Comparative Example 2 | 1 | 1 | 1 | 67 |
| Comparative Example 3 | 1 | 1 | 1 | 30 |
| Comparative Example 4 | 3 | 5 | 1 | 20 |

When a square wave pulse having a dc current of 200 A flows as the primary electric current $I_1$, the secondary electric current $I_2$ was measured by a two-channel oscilloscope.

Figure 27:
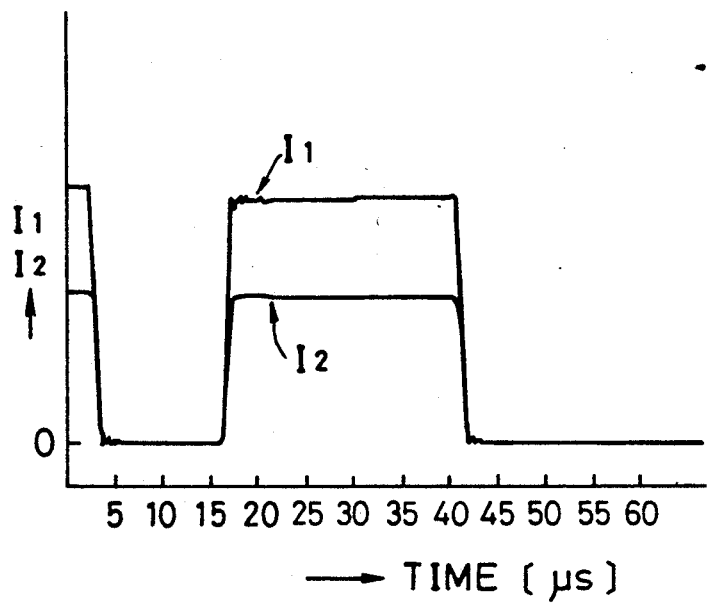
FIG. 27 illustrates primary and secondary electric current waveforms of Embodiment 1 of the present invention.
Figure 28:
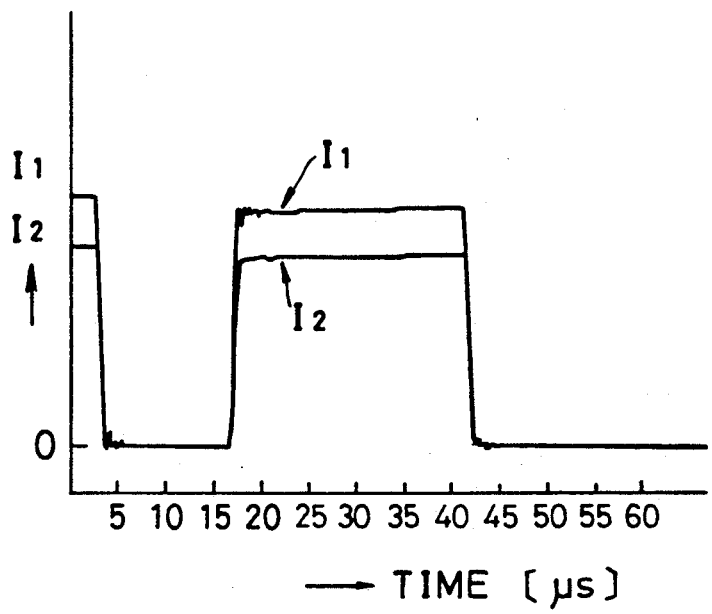
FIG. 28 illustrates primary and secondary electric current waveforms of Embodiment 2 of the present invention.
Figure 29:
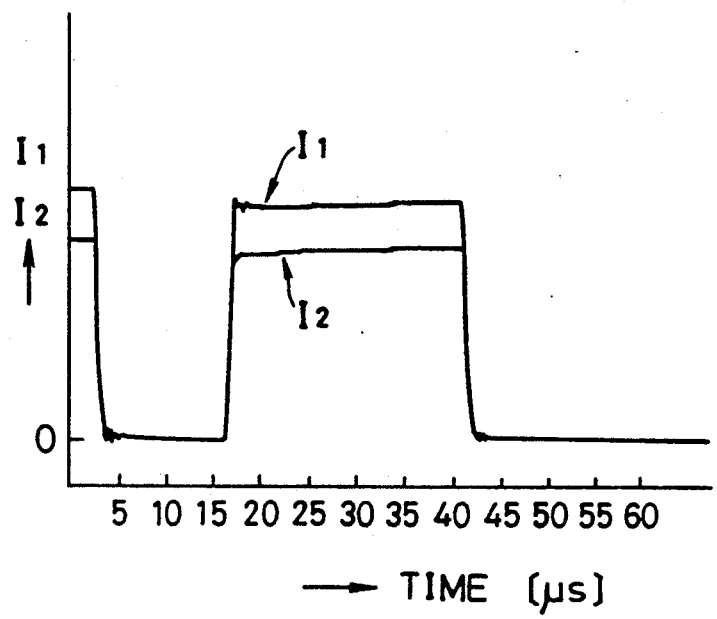
FIG. 29 illustrates primary and secondary electric current waveforms of Embodiment 3 of the present invention.
Figure 30:
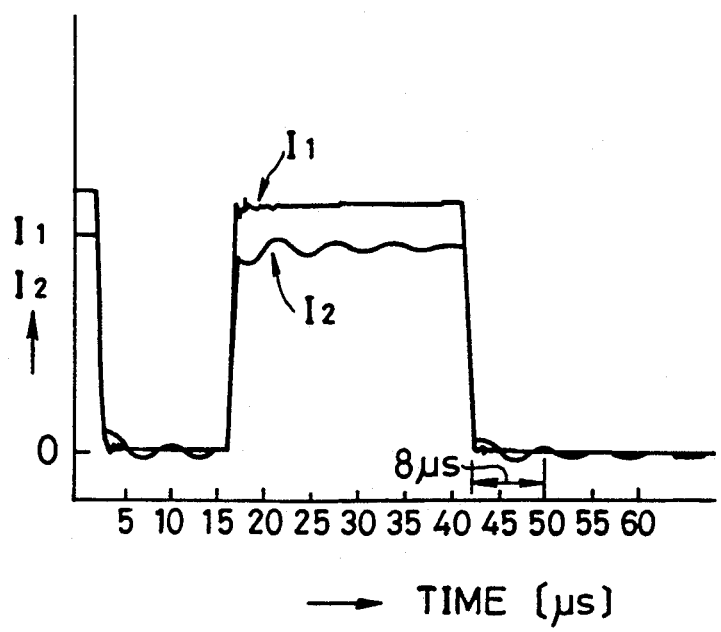
FIG. 30 illustrates primary and secondary electric current waveforms of Comparative Example 1 of the present invention.
Figure 31:
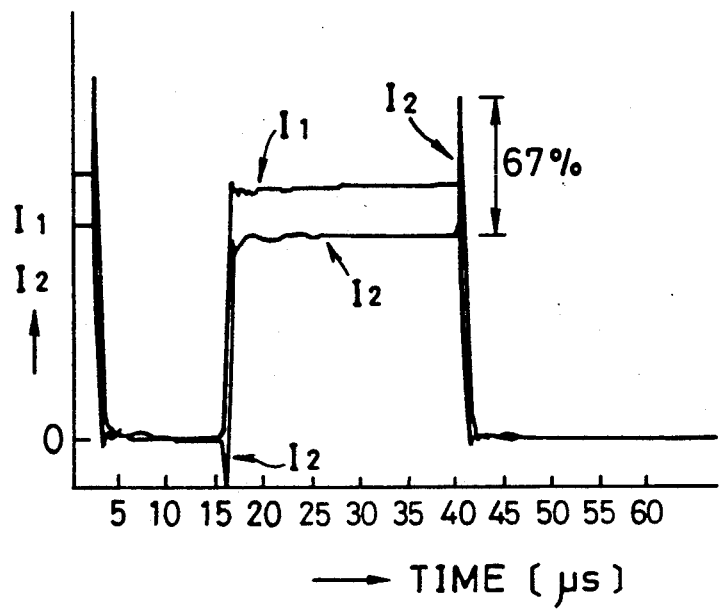
FIG. 31 illustrates primary and secondary electric current waveforms of Comparative Example 2 of the present invention.
Figure 32:
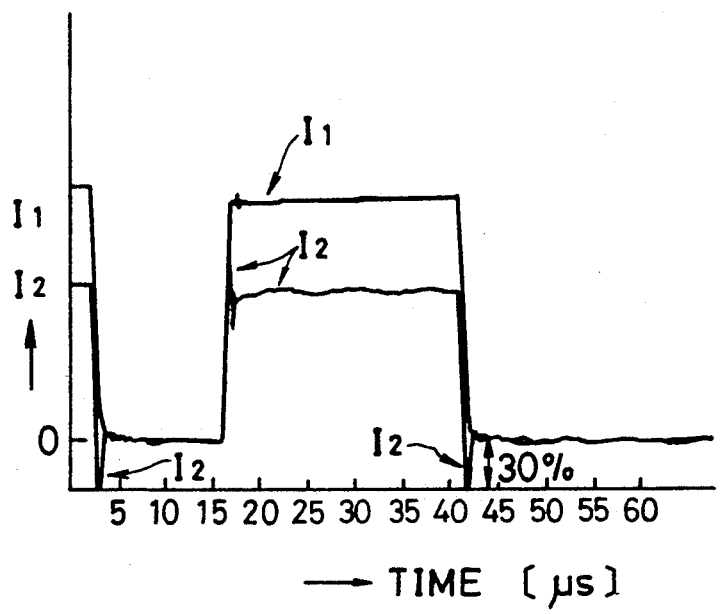
FIG. 32 illustrates primary and secondary electric current waveforms of Comparative Example 3 of the present invention.
Figure 33:
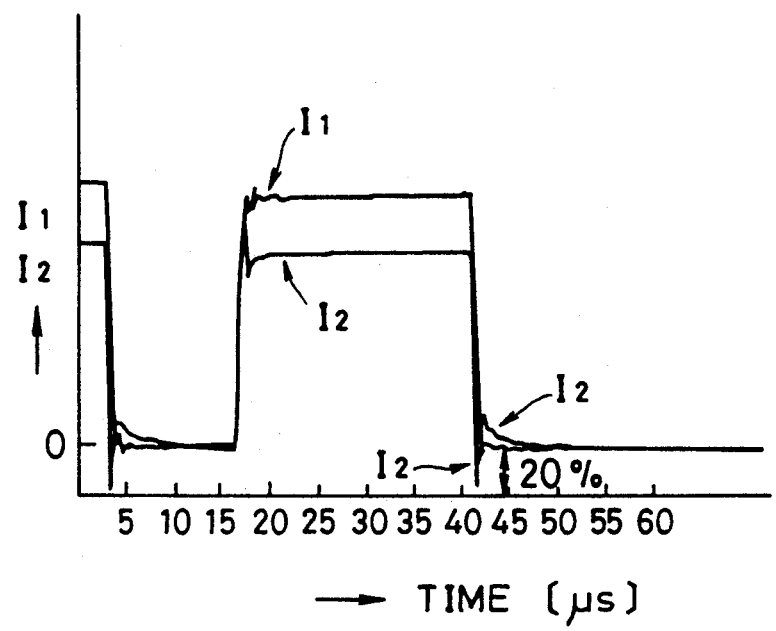
FIG. 33 illustrates primary and secondary electric current waveforms of Comparative Example 4 of the present invention.

FIGS. 27 to 33 show waveforms of the primary electric current $I_1$ and waveforms of the secondary electric current $I_2$. The above data in Table 1 were obtained from these waveforms. FIGS. 27, 28 and 29 show examples of waveforms of Embodiments 1, 2 and 3 of the present invention, respectively. FIGS. 30, 31, 32 and 33 show examples of waveforms of Comparative Example 1, 2, 3 and 4 against the present invention, respectively. In these waveform diagrams, the abscissa axis indicates time and one division of the scale correspond to 5 $\mu$s.

If the number of turns of the primary winding is $N_1$ and the number of turns of the secondary winding is $N_2$, $I_2 = (N_1/N_2) \cdot I_1$ is obtained from $I_1 \cdot N_1 = I_2 \cdot N_2$ according to the equi ampere turns law. In the above case where $N_1 = 1$, $N_2 = 2500$ and $I_1 = 200$ A, $I_2$-80 mA is obtained. That is, the secondary $I_2$ is a square wave having a peak value of 80 mA.

Summarizing the above experimental results, the following conclusions are obtained:

(1) As shown in the results of Comparative Examples 1 to 4, the prior art apparatus does not detect a large current of a square-wave pulse flowing through the primary winding at a high speed and with good fidelity. A response time is increased due to a response delay. A settling time is increased due to damping oscillation. A peak value becomes excessively small or large due to a transient spike noise.

(2) As shown in the results of Embodiments 1 to 3, an electric current detecting apparatus in accordance with the present invention shows good frequency response characteristics, so that a large pulse current can be detected at a high speed and with good fidelity.

(3) In the prior art apparatus shown in FIGS. 3-5 (Comparative Example 1), it is required that a plurality of gaps 3 and a plurality of magnetoelectric transducers 4 are arranged on the looped core 2, in order that an error to be caused by a change in a location and a shape of the primary winding is avoided. According to the present invention, only one magnetoelectric transducer 4 is sufficient to enhance the frequency response characteristics, even though a plurality of transducers 4 can be housed in the respective gaps 3 and 8.

(4) Since the looped core 2 of the present invention can be formed by laminating ferromagnetic material sheets of the same shape, for example, as shown in the structure of FIG. 11, the core 2 has such an advantage that the core can be easily assembled and the number of parts thereof is small.

(5) In the conventional looped core 2 having the gap 3 interrupting the core or its magnetic circuit, in order that an apparent sensitivity of the magnetoelectric transducer 4 is prevented from being lowered due to increase in the gap clearance, or that the magnetoelectric transducer 4 is prevented from being deteriorated or damaged due to decrease in the gap clearance, there is provided separately additional means for fixing an edge surface of the looped core 2 at the gap 3. In contrast, the looped core 2 of the present invention is provided with the continuous portion 7 at the gaps 3 and 8, so that it is not necessary to separately incorporate the above means as long as the laminated ferromagnetic material sheets are fixed to each other by bonding or welding. In this way, the present invention avoids the above problems.

Furthermore, the continuous portion 7 of the looped core 2 of the present invention also functions to fix the center axis of the magnetic circuit of the core 2 at the gaps 3 and 8 so as to prevent misalignment of the center axis. In other words, the misalignment of the magnetic circuit is prevented by the continuous portion 7 which functions as the fixing means when the ferromagnetic material sheets are laminated. As a result, an electric current detecting apparatus in accordance with the present invention has a high reliability, i.e., good performances are maintained for a long period of time.

(6) In the conventional structure as shown in FIG. 3, it is necessary to bend lead terminals of the magnetoelectric transducer 4 inside the secondary winding 5 when the lead terminals are extended externally. In contrast, according to the present invention, it is easy to fix the magnetoelectric transducer 4 to the gap 3 and to connect lead wires to the transducer 4, as shown in FIGS. 15 to 20. This removes poor factors such as breakage of lead wires, short circuit among lead terminals or the like to improve reliability of an electric current detecting apparatus.

Various modification of the above-described embodiments are shown in FIGS. 34-40.

Figure 34:
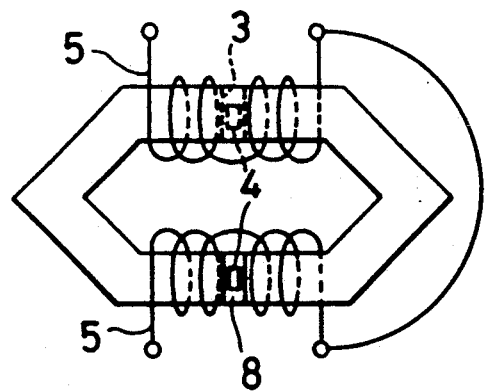
FIG. 34 shows another embodiment of the looped core in the present invention.
Figure 35:
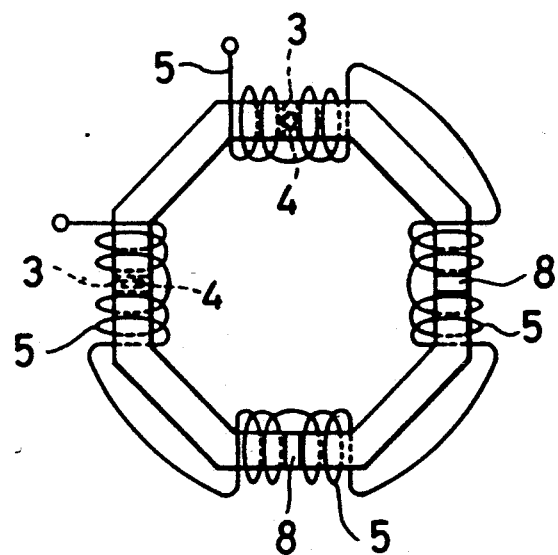
FIGS. 35, 36, 37 and 38 show four embodiments of the four gaps in the present invention.

FIGS. 34 and 35 show the core 2 having hexagon and octagon, respectively.

In FIG. 34, one pair of secondary windings 5 are wound around the two opposite arms. In FIG. 35, two pairs of secondary windings 5 are wound around the two pairs of two opposite arms.

Figure 36:
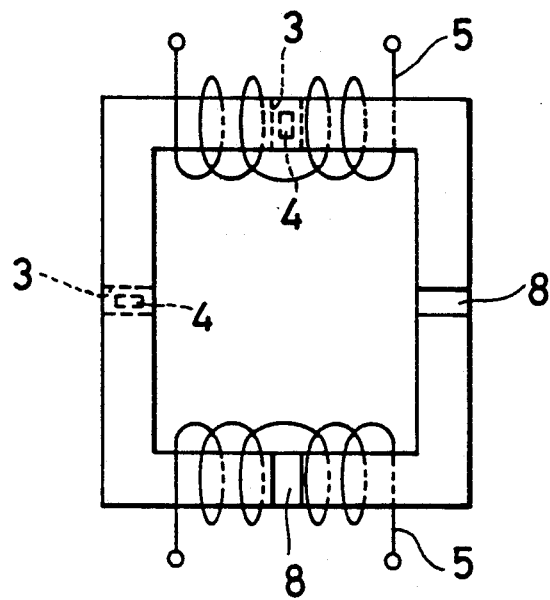
Figure 37:
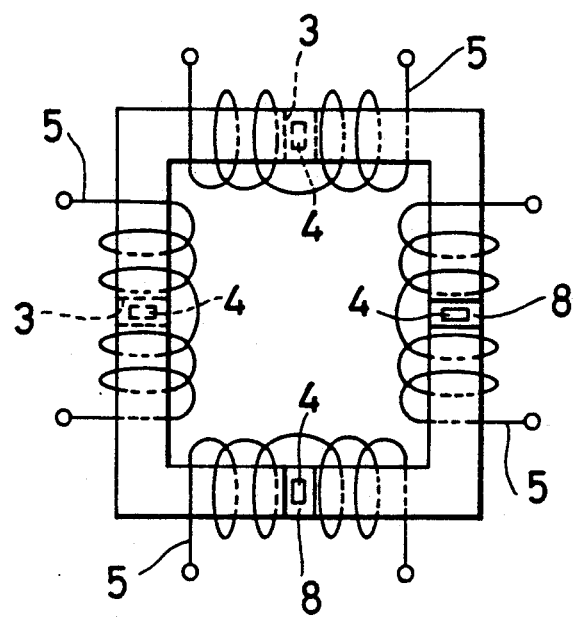
Figure 38:
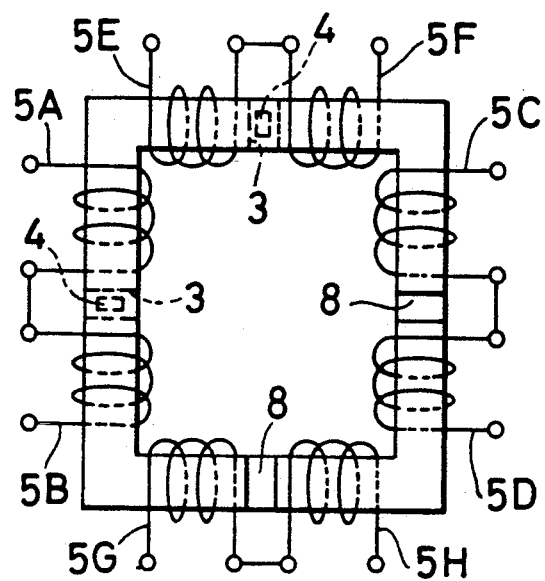

FIG. 36-38 show embodiments having two pairs of the gaps 3 and 8 arranged oppositely. In FIG. 36, only one pair of secondary windings 5 are wound around the opposite core arms having the gaps 3 and 8. In FIG. 37, two pairs of secondary windings 5 are wound around two pairs of opposite core arms having the gaps 3 and 8, respectively. In FIG. 38, each secondary windings 5 shown in FIG. 37 is divided into four pairs of the two windings 5A and 5B, 5C and 5D, 5E and 5F, and 5G and 5H and the gaps 3 and 8 are disposed between the respective pairs of the two windings 5A and 5B, 5C and 5D, 5E and 5F, and 5C and 5H.

Figure 39:
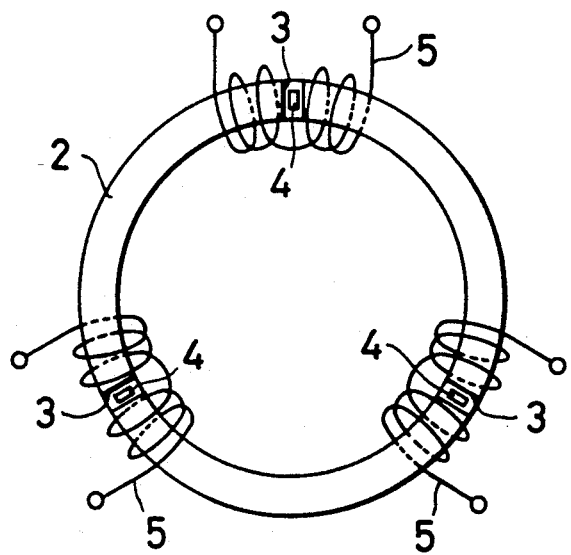
FIGS. 39 and 40 show two embodiments when the looped core has a ring-like shape.

FIG. 39 shows an embodiment having three gaps 3 arranged radially and equi-angularly along a circular ring shaped core 2 with respect to the center of the core 2. In this embodiment, the secondary windings 5 are wound around the respective gaps 3. Further, in the case of the circular core 2 having the circular ring shaped, the even or odd number of gaps 3 and secondary windings 5 can be arranged.

Figure 40:
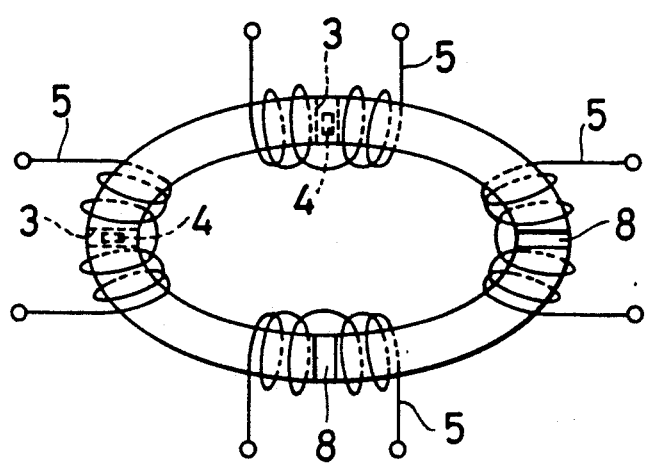

FIG. 40 shows an embodiment where the looped core 2 has an oval ring shape. The two gaps 3 are arranged oppositely and the gaps 8 are also arranged oppositely.

The secondary windings 5 are wound around the gaps 3 and 8.

The present invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. An electric current detecting apparatus of a magnetic balanced type, comprising: a core of ferromagnetic material formed in a continuous loop, which material defines a completely closed magnetic circuit, said core having at least two variations in the cross-sectional configuration of the core which form two respective gaps of material extending only partially through respective cross-sections of the core; a primary winding comprising a conductor inserted into said looped core in which conductor a primary current to be detected is passing therethrough for generating a magnetic flux in said looped core; at least one electromagnetic transducer arranged in at least one of said gaps configured to generate an output signal in accordance with said magnetic flux; and at least two secondary windings wound around said looped core to receive a secondary current passed therethrough in accordance with a signal for cancelling said magnetic flux so that said primary current is detected,
wherein
said at least two gaps and said at least two secondary windings are symmetrically arranged in said looped core, respectively, so as to obtain a uniform distribution of said magnetic flux in said looped core.

2. An electric current detecting apparatus as claimed in claim 1, wherein said looped core is a laminated structure having a plurality of ferromagnetic material sheets laminated.

3. An electric current detecting apparatus as claimed in claim 1, wherein said looped core has a circular ring shape.

4. An electric current detecting apparatus as claimed in claim 1, wherein said looped core has an oval ring shape.

5. An electric current detecting apparatus as claimed in claim 1, wherein said magnetoelectric transducer is a Hall effect element.

6. An electric current detecting apparatus as claimed in claim 1, wherein said magnetoelectric transducer is a magnetoresistance element.

7. An electric current detecting apparatus of a magnetic balanced type comprising; a core of ferromagnetic material formed in a continuous polygon-shaped loop, which material defines a completely closed magnetic circuit, said core having at least one pair of opposite arms and at least two variations in the cross-sectional configuration of the arms which form two respective gaps of material extending only partially through respective cross-sections of said arms; a primary winding comprising a conductor inserted into said looped core into which a primary current to be detected may be passed therethrough for generating a magnetic flux in said looped core; at least one magnetoelectric transducer arranged in at least one of said gaps configured to generate an output signal in accordance with said magnetic flux; and at least two secondary windings wound around said looped core to receive a secondary current passed therethrough in accordance with said signal for cancelling said magnetic flux so that said primary current is detected, wherein said at least two gaps and said at least two secondary windings are oppositely arranged in said opposite arms, respectively, so as to obtain a uniform distribution of said magnetic flux in said looped core.

8. An electric current detecting apparatus as claimed in claim 7, wherein said looped core is a laminated structure having a plurality of ferromagnetic material sheets laminated.

9. An electric current detecting apparatus as claimed in claim 7, wherein said looped core is a polygon loop having even number of corners.

10. An electric current detecting apparatus as claimed in claim 9, wherein said looped core is a square loop.

11. An electric current detecting apparatus as claimed in claim 9, wherein said polygon loop is a rectangular loop.

12. An electric current detecting apparatus as claimed in claim 7, wherein each of said arms has one secondary winding.

13. An electric current detecting apparatus as claimed in claim 7, wherein each of said arms has at least two secondary windings.

14. An electric current detecting apparatus as claimed in claim 7, wherein said magnetoelectric transducer is a Hall effect element.

15. An electric current detecting apparatus as claimed in claim 7, wherein said magnetoelectric transducer is a magnetoresistance element.

16. An electric current detecting apparatus as claimed in claim 1 wherein said conductor is inserted along the center axis of said core and wherein the combined structure of said looped core, said gaps and said secondary windings is symmetrical around first and second lines which are orthogonal to one another and which define a plane that bisects said core and is perpendicular to the center axis of said core.

17. An electric current detecting apparatus as claimed in claim 7 wherein said conductor is inserted along the center axis of said core and wherein the combined structure of said looped core, said gaps and said secondary windings is symmetrical around first and second lines which are orthogonal to one another and which define a plane that bisects said core and is perpendicular to the center axis of said core.

* * * * *

UNITED STATES PATENT AND TRADEMARK OFFICE
CERTIFICATE OF CORRECTION

PATENT NO. : 5,241,263
DATED : August 31, 1993
INVENTOR(S) : Toshio Naoi et al.

It is certified that error appears in the above-indentified patent and that said Letters Patent is hereby corrected as shown below:

Claim 7, column 12, line 54, "comprising;" to --comprising:--.

Signed and Sealed this

Fifth Day of July, 1994

BRUCE LEHMAN

Attest:

*Attesting Officer*  *Commissioner of Patents and Trademarks*